Aug. 19, 1969 A. G. COBLENZ 3,462,655
SEMICONDUCTOR WAFER FORMING A PLURALITY OF RECTIFIERS
Filed Dec. 1, 1967
FIG. 1
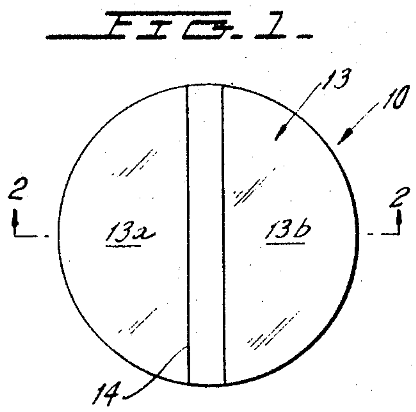
FIG. 2
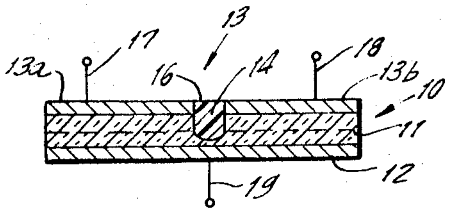
FIG. 3
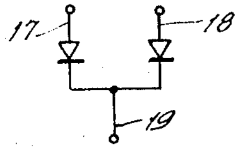
FIG. 4
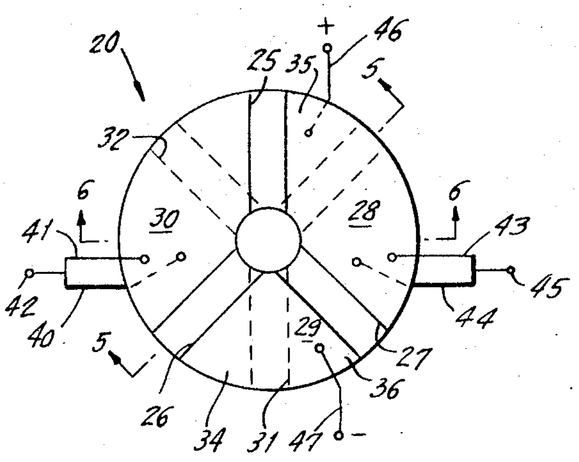
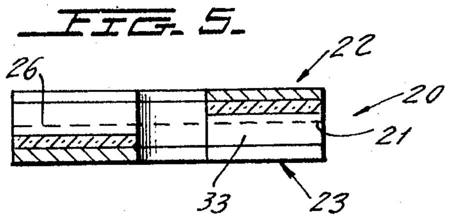
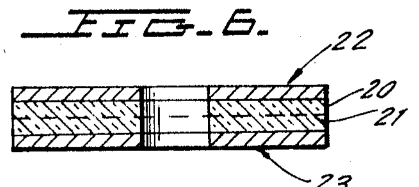
FIG. 7
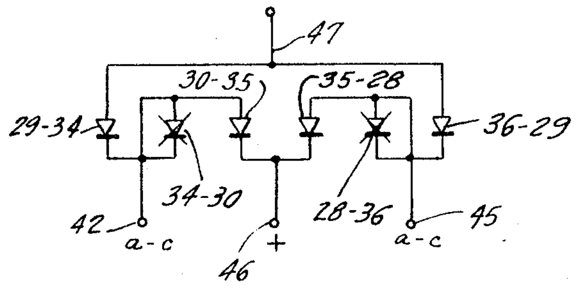
INVENTOR.
ABRAHAM G. COBLENZ
BY
OSTROLENK, FABER, GERB & SOFFEN
ATTORNEYS United States Patent Office 3,462,655
Patented Aug. 19, 1969

3,462,655

SEMICONDUCTOR WAFER FORMING A PLURALITY OF RECTIFIERS

Abraham G. Coblenz, El Segundo, Calif., assignor to International Rectifier Corporation, El Segundo, Calif., a corporation of California Filed Dec. 1, 1967, Ser. No. 687,365
Int. Cl. H01l 5/02
U.S. Cl. 317—234 4 Claims

ABSTRACT OF THE DISCLOSURE

A single wafer of semiconductor material has a junction therein and one or more slots extending from one or both surfaces through the junction to divide the wafer into two or more separate and interconnected wafers. Three slots on each surface divide the wafer into six segments, two of which have the junction short circuited to form a single phase full-wave rectifier.

This invention relates to semiconductor rectifiers, and more particularly relates to the formation of a complete rectifier circuit from a single wafer.

It is, therefore, a primary object of this invention to form a compact and inexpensive rectifier circuit.

Another object of this invention is to form full-wave rectifier circuit arrangements in a single device which could be contained in a single housing.

These and other objects of this invention will become apparent from the following description when taken in connection with the drawings in which:

FIGURE 1 is a top view of a wafer of semiconductor material having a groove therein.

FIGURE 2 is a cross-sectional view of FIGURE 1 taken across section line 2—2 in FIGURE 1.

FIGURE 3 shows the circuit formed by the device of FIGURE 2.

FIGURE 4 shows a top view of a semiconductor wafer formed in accordance with a second embodiment of the invention.

FIGURE 5 is a cross-sectional view of FIGURE 4 taken across section line 6—6 in FIGURE 4.

FIGURE 6 is a cross-sectional view of FIGURE 4 taken across section line 6—6 in FIGURE 4.

FIGURE 7 shows the circuit formed by the device of FIGURES 4, 5 and 6.

Referring first to FIGURES 1 and 2, there is illustrated a semiconductor wafer 10 which may be of silicon, or any of the other semiconductor materials formed into monocrystalline wafers. The wafer 10 has a P-N junction 11 therein, formed in any desired manner, and is provided with first and second electrode plates 12 and 13 formed of molybdenum, tungsten, or the like, also in the usual manner.

A groove 14 is then formed across the top of wafer 10, cutting through electrode plate 13 to form segments 13*a* and 13*b* and into wafer 10, cutting through junction 11, and stopping short of the bottom of the wafer 10. Groove 14 can be formed in any desired manner as by cutting with a diamond saw or etching, and can be filled with a suitable sealing material 16. In a typical device, wafer 10 could have a diameter of 1 inch, and a thickness of 10 mils, with the junction 11 disposed in the center of the wafer. Groove 14 then extends into wafer 11 for about 8 mils, cutting through junction 11, and a width of about 10 mils.

Leads 17 and 18 are then connected to plate segments 13*a* and 13*b*, while lead 19 is connected to plate 12. The completed device will then be placed in a suitable housing, not shown, and forms the double rectifier circuit shown in FIGURE 3. This circuit has many obvious direct circuit applications which normally require the use of two separate rectifier components.

FIGURES 4 to 7 show how the invention can be adapted to form a single phase, full-wave rectifier circuit.

In FIGURES 4 to 6, a semiconductor wafer 20, similar to wafer 10 of FIGURES 2 and 3, has a suitable junction 21 therein. The top of wafer 20 receives an upper electrode plate 22 and the bottom receives a lower electrode plate 23.

Plate 22 receives three grooves or slots 25, 26 and 27, each of which extends through junction 21 and which separates plate 22 into three segments 28, 29 and 30. In a similar manner, three slots 31, 32 and 33 are formed through botom plate 23 and which have a depth sufficient to extend through junction 21. Slots 31, 32 and 33 are rotated with respect to slots 25, 26 and 27 so that segments 28, 29 and 30 of plate 22 overlap the equivalent adjacent segments 34, 35 and 36 former by slots 31, 32 and 33. If desired, slots 25, 26, 27, 31, 32 and 33 can intersect at an opening formed in the center of the wafer. In particular, there are six overlapping segment portions, as shown in FIGURE 4, each of which defines an individual rectifier element. These six overlapping segments are defined between overlapping segments 28–35; 28–36; 29–36; 29–34; 30–34; and 30–35.

In accordance with the invention, and to form a single-phase full-wave bridge rectifier circuit, a first pair of A-C input leads 40 and 41, connected to terminal 42, are connected to segments 34 and 30, respectively. This short-circuits the junction between these two elements, schematically shown by the cross through diode 34–30 in FIGURE 7. Similarly, a second pair of input leads 43 and 44, connected to A-C terminal 45, are connected to segments 28 and 36, respectively, to short the junction 28–36, as shown by the cross in FIGURE 7. A positive D-C lead 46 is connected to segment 35 and a negative D-C lead 47 is connected to segment 29.

The resulting device is then placed in a suitable single housing having two A-C leads and two D-C leads extending therefrom, the full-wave single phase bridge arrangement having obvious circuit applications previously obtained only by four separate rectifier devices.

Although this invention has been described with respect to its preferred embodiments, it should be unledstood that many variations and modifications will now be obvious to those skilled in the art, and it is preferred, therefore, that the scope of the invention be limited not by the specific disclosure herein, but only by the appended claims.

The embodiments of the invention in which an exclusive privilege or property is claimed are defined as follows:

1. A plurality of devices in a common wafer comprising a single wafer of monocrystalline semiconductor material having first and second flat, parallel surfaces; a P-N junction extending across said wafer parallel to said first and second surfaces; a first and second plurality of grooves each extending radially outwardly from the center of said wafer formed in said first and second surfaces, respectively; said plurality of grooves having a depth sufficient to extend from their respective surface of said flat, parallel surfaces and through said junction; said first and second plurality of grooves dividing their respective first and second surfaces into first and second pluralities of isolated segmental areas; said first and second plurality of grooves rotated with respect to one another whereby the said areas formed between said grooves on opposite surfaces are overlapped with respect to one another; and first electrical lead means connected to at least two of said segmental areas which overlap one another and second lead means connected to a third of said segmental areas.

2. The structure of claim 1 which includes first and second expansion plates connected across said first and second surfaces; said first and second plurality of grooves extending through said first and second expansion plates, respectively.

3. The structure of claim 1 wherein said first and second plurality of grooves are each comprised of three grooves forming three segments on each of said top and bottom surfaces; said first lead means comprising first and second leads connected to adjacent and overlapping first and second segments on said top and bottom surfaces, respectively; said second lead means comprising first and second D-C output leads connected to said first and second segments, respectively.

4. The structure of claim 3 which includes first and second expansion plates connected across said first and second surfaces; said first and second plurality of grooves extending through said first and second expansion plates, respectively.

References Cited

UNITED STATES PATENTS

| | | | |
|---|---|---|---|
| 3,159,780 | 12/1964 | Parks | 321—46 |
| 3,193,783 | 7/1965 | Brook | 332—52 |
| 3,206,619 | 9/1965 | Lin | 307—88.5 |

JAMES D. KALLAM, Primary Examiner

R. F. POLISSACK, Assistant Examiner

U.S. Cl. X.R.

317—235